United States Patent
Yokoyama et al.

(10) Patent No.: US 6,586,973 B2
(45) Date of Patent: Jul. 1, 2003

(54) OUTPUT BUFFER CIRCUIT

(75) Inventors: Masahiro Yokoyama, Tokyo (JP); Kouji Nasu, Tokyo (JP); Syuichi Shirata, Tokyo (JP); Satie Kuroda, Tokyo (JP); Teruaki Kanzaki, Tokyo (JP); Akihito Uehara, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/421,932

(22) Filed: Oct. 21, 1999

(65) Prior Publication Data

US 2002/0075049 A1 Jun. 20, 2002

(30) Foreign Application Priority Data

May 21, 1999 (JP) .......................... 11-141250

(51) Int. Cl.[7] .............................. H03B 1/00
(52) U.S. Cl. ....................... 327/108; 327/112
(58) Field of Search .................. 326/26, 27, 82, 326/83, 87, 86; 327/392–396, 108–112, 170, 276, 281

(56) References Cited

U.S. PATENT DOCUMENTS

| | | | | |
|---|---|---|---|---|
| 4,638,187 A | * | 1/1987 | Boler et al. | 326/87 |
| 4,922,141 A | * | 5/1990 | Lofgren et al. | 327/276 |
| 5,519,344 A | * | 5/1996 | Proebsting | 326/82 |
| 5,534,791 A | * | 7/1996 | Mattos et al. | 326/27 |
| 5,570,294 A | * | 10/1996 | McMinn et al. | 327/276 |
| 5,694,065 A | * | 12/1997 | Hamasaki et al. | 326/83 |
| 5,739,707 A | * | 4/1998 | Barraclough | 327/112 |
| 5,770,960 A | * | 6/1998 | Iadanza et al. | 327/281 |
| 5,834,860 A | * | 11/1998 | Parsons et al. | 327/391 |
| 5,923,192 A | * | 7/1999 | Hasegawa | 327/112 |
| 5,963,071 A | * | 10/1999 | Dowlatabadi | 327/276 |
| 5,969,552 A | * | 10/1999 | Lee et al. | 327/276 |
| 6,087,847 A | * | 7/2000 | Mooney et al. | 326/86 |
| 6,097,231 A | * | 8/2000 | Moscaluk | 327/393 |
| 6,124,747 A | * | 9/2000 | Nasu | 327/112 |

FOREIGN PATENT DOCUMENTS

| | | |
|---|---|---|
| JP | 2-124632 | 5/1990 |
| JP | 5-206828 | 8/1993 |
| JP | 9-162719 | 6/1997 |

* cited by examiner

*Primary Examiner*—Kenneth B. Wells
*Assistant Examiner*—Long Nguyen
(74) *Attorney, Agent, or Firm*—Burns, Doane, Swecker & Mathis, LLP

(57) ABSTRACT

An output buffer circuit is provided for maintaining the slew rate of output waveforms of the output signal within a predetermined range regardless of changes of load on the output terminal. Series-connected feedback delay circuits (11–14) delay an input signal (IN) on the basis of the potential of an output signal (OUT) obtained through a feedback path (L1). Delay time of each feedback delay circuit varies according to load on an output terminal (2). Delay signals from the feedback delay circuits (11–14) are applied to one inputs of high-output selecting NAND gates (G11–G14), respectively. The NAND gates (G11–G14) also receive the input signal (IN) at their other inputs and output signals to gates of high output transistors (QP1–QP4), respectively. At the rise of the input signal (IN), the high output transistors (QP1–QP4) output the output signal (OUT) in response to the delay signals from the feedback delay circuits (11–14).

11 Claims, 11 Drawing Sheets

OUTPUT BUFFER CIRCUIT

BACKGROUND OF THE INVENTION

The present invention relates to an output buffer circuit.

DESCRIPTION OF THE BACKGROUND ART

FIG. 14 is a circuit diagram showing the operating principles of a conventional output buffer circuit with slew-rate controlling capability. As shown, high output transistors QP21 through QP24 and low output transistors QN21 through QN24 are provided in four stages between an input terminal 91 and an output terminal 92. Sources of the high output transistors QP21 through QP24 are all connected to the power supply. Their drains are connected to drains of the low output transistors QN21 through QN24, respectively, and in common to the output terminal 92. Sources of the low output transistors QN21 through QN24 are all grounded.

An input signal IN received from the input terminal 91 is applied to a gate of the high output transistor QP21 and delay circuits 111 and 121. Delay circuits 111 through 113 are connected in series and delay circuits 121 through 123 are connected in series. Each delay circuit delay the input signal IN by a predetermined time interval.

Output signals from the delay circuits 111, 112, and 113 are applied to gates of the high output transistors QP22, QP23, and QP24, respectively.

Output signals from the delay circuits 121, 122, and 123 are applied to gates of the low output transistors QN22, QN23, and QN24, respectively.

In this circuit configuration, the delay circuits 111 through 113 cause a time lag among the high output transistors QP21 through QP24 so that the input signal IN is sequentially applied to the gates of the transistors QP21 through QP24 in this order. Also, the delay circuits 121, 122, and 123 cause a time lag among the low output transistors QN21 through QN24 so that the input signal IN is sequentially applied to the gates of the transistors QN21 through QN24 in this order.

When the input signal IN makes a HIGH to LOW or LOW to HIGH transition, the high output transistors QP21 through QP24 or the low output transistors QN21 through QN24 are turned on in sequence after a time lag. Thus, slew rate of an output signal OUT during periods of relatively heavy load on the output terminal 92 is brought close to that during periods of relatively light load on the output terminal 92.

By raising the slew rate during periods of relatively heavy load on the output terminal 92, the conventional output buffer circuit has relieved a difference in the slew rate of the output signal OUT due to changes of the load on the output terminal 92.

However, even if the transistor characteristics change according to load capacity of the output terminal 92 or ambient temperature, the delay circuits 111 through 113 and the delay circuits 121 through 123 cause a constant time lag among the high output transistors QP21 through QP24 and the low output transistors QN21 through QN24, respectively. Therefore, the conventional output buffer circuit in FIG. 14 has been posing a problem of the occurrence of variations in the slew rate of output waveforms of the output signal OUT due to changes of the load on the output terminal 92, as indicated by P1 through P4 in FIG. 4.

Another problem is high current consumption. That is, even if the load on the output terminal 92 is light enough to achieve good slew rate only with a single inverter, the conventional output buffer circuit turns on the four transistors in sequence, which is equivalent to driving four inverters in sequence. This requires extra current.

SUMMARY OF THE INVENTION

A first aspect of the present invention is directed to an output buffer circuit comprising: an input terminal receiving an input signal; an output terminal outputting an output signal; a delay circuit for delaying the input signal by a delay time to output a delay signal, the delay time varying according to a potential of the output signal; and an output buffer portion for outputting the output signal in response to a relative input signal correlated with the input signal, the output buffer portion receiving a relative delay signal correlated with the delay signal, a driving capability of the output buffer portion to the relative input signal varying according to the delay time.

According to a second aspect of the present invention, in the output buffer circuit of the first aspect, the delay time includes a plurality of delay times; the delay signal includes a plurality of delay signals obtained by delaying the input signal by the plurality of delay times; the output buffer portion includes a plurality of buffer portions provided in a one-to-one correspondence with the plurality of delay signals, for outputting the output signal in response to the plurality of delay signals; and the relative input signal and the relative delay signal are the same signal including the plurality of delay signals.

According to a third aspect of the present invention, in the output buffer circuit of the first aspect, the relative input signal includes the input signal, the output buffer circuit further comprising: a plurality of data storage portions for storing control data, each receiving the delay signal at a different input time that elapses from a logic level transition on the input signal, and if the delay signal makes the logic level transition, setting the control data to indicate a halt in the operation of the output buffer, wherein the relative delay signal includes the control data in the plurality of data storage portions; wherein the output buffer portion includes a plurality of buffer portions provided in a one-to-one correspondence with the plurality of data storage portions, the operating/halting status of each of the plurality of output buffer portions being determined on the basis of the control data stored in a corresponding data storage portion.

According to a fourth aspect of the present invention, in the output buffer circuit of the first aspect, the input signal has first and second logic levels; and the output buffer portion includes a first logic output portion for setting the output signal to the first logic level under operating conditions on the basis of the relative delay signal, and a second logic output portion for setting the output signal to the second logic level under operating conditions on the basis of the relative delay signal. The output buffer circuit further comprises: a first logic output control portion for bringing the first logic output portion into operation when the input signal makes a first transition from the second logic level to the first logic level; and a second logic output control portion for bringing the second logic output portion into operation when the input signal makes a second transition from the first logic level to the second logic level.

According to a fifth aspect of the present invention, the output buffer circuit of the third aspect further comprises an input time setting portion for setting the input time of each of the plurality of data storage portions on the basis of a plurality of RC delay signals obtained by delaying the input signal with RC time constant.

According to a sixth aspect of the present invention, the output buffer circuit of the third aspect further comprises an output buffer starting portion for activating the output buffer portion at a time when a predetermined condition is satisfied, by setting the control data in the plurality of storage portions to indicate the operation of the output buffer.

According to a seventh aspect of the present invention, in the output buffer circuit of the sixth aspect, the time when the predetermined condition is satisfied includes a time of power-on and a time of reset.

According to an eighth aspect of the present invention, in the output buffer circuit of the sixth aspect, the output buffer starting portion has a timer function, for monitoring a state of the output signal at predetermined time intervals and activating the output buffer portion at a time when the state of the output signal does not satisfy a predetermined criterion, as the time when the predetermined condition is satisfied.

According to a ninth aspect of the present invention, in the output buffer circuit of the sixth aspect, the output buffer starting portion includes an output potential monitoring portion for performing logical operation on the basis of the potential of the output signal, and monitoring the potential of the output signal all the time on the basis of the result of the logical operation; and the time when the predetermined condition is satisfied includes a time when the potential of the output signal does not satisfy a predetermined criterion according to the result of the logical operation.

In the output buffer circuit according to the first aspect, the driving capability of the output buffer portion to the relative input signal varies according to the delay time and the delay time varies according to the potential of the output signal.

The potential of the output signal and the delay time can thus be correlated so that the driving capability of the output buffer portion is improved when the load on the output terminal is relatively heavy and is impaired when the load is relatively light on the basis of the potential of the output signal. This allows the slew rate of the output waveforms of the output signal to be maintained within a predetermined range regardless of changes of the load on the output terminal.

In the output buffer circuit according to the second aspect, the plurality of output buffer portions output the output signal in response to the plurality of delay signals obtained by delaying the input signal by the plurality of delay times, respectively. Thus, starting times for the operation of the plurality of output buffer portions in response to the input signal are delayed by a plurality of delay times, respectively.

The potential of the output signal and the plurality of delay times can thus be correlated so that the plurality of delay times are shortened when the load on the output terminal is relatively heavy and are lengthened when the load is relatively light on the basis of the potential of the output signal. Further, the driving capability of the plurality of output buffer portions can be improved when the load is relatively heavy by speeding up the starting times for the operation of the plurality of output buffer portions and can be impaired when the load is relatively light by delaying the starting times. This allows the slew rate of the output waveforms of the output signal to be maintained within a predetermined range regardless of changes of the load on the output terminal.

In the output buffer circuit according to the third aspect, the operating/stopping status of each of the plurality of output buffer portions is determined on the basis of the control data in the corresponding data storage portion.

Therefore, after the control data in the plurality of data storage portions is set to effect the operation of the plurality of output buffer portions, the potential of the output signal and the delay times can be correlated so that the delay times are lengthened when the load on the output terminal is relatively heavy and are shortened when the load is relatively light on the basis of the potential of the output signal. Further, the driving capability of the plurality of output buffer portions can be improved when the load is relatively heavy by reducing the rate of the control data which indicates a halt in the operation of the plurality of output buffer portions, in the plurality of data storage portions, and can be impaired when the load is relatively light by increasing the rate of the control data which indicates the operation of the plurality of output buffer portions. This allows the slew rate of the output waveforms of the output signal to be maintained within a predetermined range regardless of changes of the load on the output terminal.

In the output buffer circuit according to the fourth aspect, the first logic output control portion brings the first logic output portion into operation when the input signal makes the first transition, and the second logic output control portion brings the second logic output portion into operation when the input signal makes the second transition. This achieves efficient utilization of only a necessary logic output portion among the first and second logic output portions.

In the output buffer circuit according to the fifth aspect, the input time setting portion sets the input times of the plurality of data storage portions on the basis of the plurality of RC delay signals obtained by delaying the input signal with RC time constant. This allows setting of accurate input times.

In the output buffer circuit according to the sixth aspect, the output buffer starting portion activates the output buffer portions at a time when a predetermined condition is satisfied. This ensures stability in the output signal.

In the output buffer circuit according to the seventh aspect, the output buffer portions are activated at power-on and reset. This ensures stability in the output signal.

In the output buffer circuit according to the eighth aspect, the output buffer starting portion monitors the status of the output signal at predetermined time intervals and activates the output buffer portions at a time when the status of the monitored output signal does not satisfy a predetermined criterion. This ensures stability in the output signal.

In the output buffer circuit according to the ninth aspect, the output buffer starting portion activates the output buffer portions at a time when the potential of the output signal does not satisfy a predetermined criterion according to the result of the logical operation. This ensures stability in the output signal.

Further, the output potential monitoring portion may be configured as a logic circuit for performing the above logical operation. This simplifies the circuit configuration.

An object of the present invention is to provide an output buffer circuit that maintains the slew rate of the output waveforms of the output signal within a predetermined range regardless of changes of the load on the output terminal.

These and other objects, features, aspects and advantages of the present invention will become more apparent from the following detailed description of the present invention when taken in conjunction with the accompanying drawings.

DESCRIPTION OF THE PREFERRED EMBODIMENTS

1. First Preferred Embodiment

Figure 1:
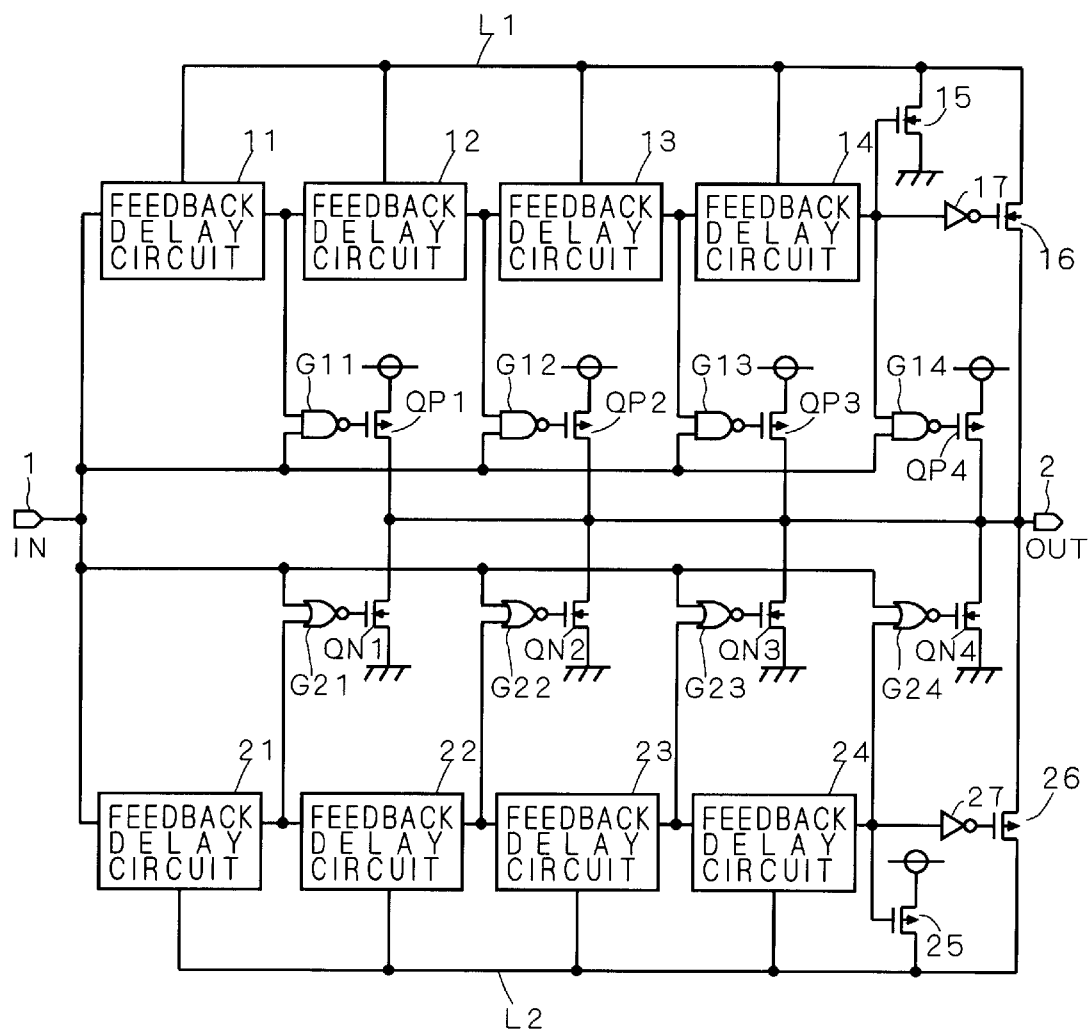
FIG. 1 shows a circuit configuration of an output buffer circuit according to a first preferred embodiment of the present invention.

FIG. 1 shows a circuit configuration of an output buffer circuit according to a first preferred embodiment of the present invention.

As shown, high output transistors QP1 through QP4 and low output transistors QN1 through QN4 are provided in four stages between an input terminal 1 and an output terminal 2.

The high output transistors QP1 through QP4 are connected at their sources to the power supply, at their gates to outputs of high-output selecting NAND gates G11 through G14, respectively, and at their drains in common to the output terminal 2. The low output transistors are connected at their sources to ground, at their gates to outputs of low-output selecting NOR gates G21 through G24, respectively, and at their drains in common to the output terminal 2.

Feedback delay circuits 11 through 14 are connected in series, for delaying an input signal IN received from the input terminal 1. Delay signals of the input signal IN (i.e. signals are relative to the input signal and to the delay signal) from the delay circuits 11 through 14 are applied to one inputs of the high-output selecting NAND gates G11 through G14, respectively. The high-output selecting NAND gates G11 through G14 also receive the input signal IN (i.e. relative input signal) at their other input.

Feedback delay circuits 21 through 24 are connected in series, for delaying the input signal IN received from the input terminal 1. Delay signals of the input signal IN (i.e. signals are relative to the input signal and to the delay signal) from the delay circuits 21 through 24 are applied to one input of the low-output selecting NOR gates G21 through G24, respectively. The low-output selecting NOR gates G21 through G24 also receive the input signal IN (i.e. relative input signal) at their other input.

The delay signal from the feedback delay circuit 14 is also applied to a gate of a feedback initialization N-channel transistor 15 and an input of an inverter 17. The feedback initialization N-channel transistor 15 is connected at its source to ground and at its drain to a feedback path L1. The feedback path L1 is connected in common to delay control input ends of the feedback delay circuits 11 through 14. The output from the inverter 17 is applied to a gate of a feedback switch N-channel transistor 16. The feedback switch N-channel transistor 16 is connected at its drain to the feedback path L1 and at its source to the output terminal 2.

The delay signal from the feedback delay circuit 24 is also applied to a gate of a feedback initialization P-channel transistor 25 and an input of an inverter 27. The feedback initialization P-channel transistor 25 is connected at its source to the power supply and at its drain to a feedback path L2. The feedback path L2 is connected in common to delay control input ends of the feedback delay circuits 21 through 24. The output from the inverter 27 is applied to a gate of a feedback switch P-channel transistor 26. The feedback switch P-channel transistor 26 is connected at its drain to the feedback path L2 and at its source to the output terminal 2.

Figure 2:
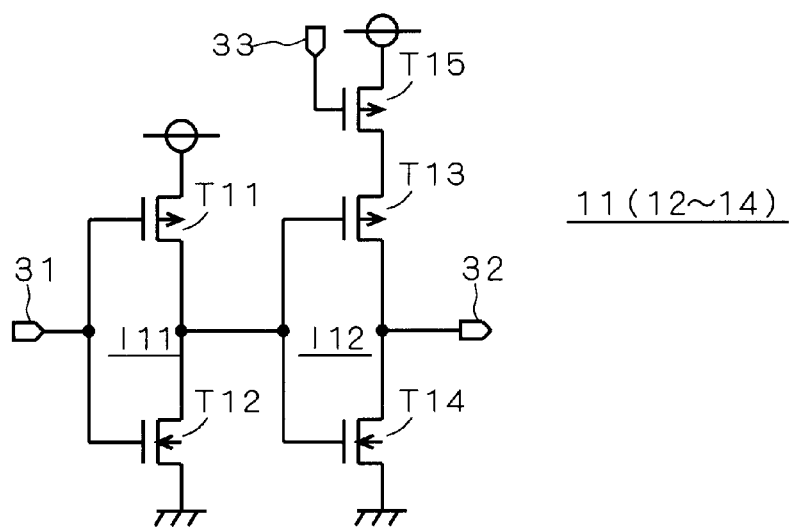
FIG. 2 shows an internal circuit configuration of a feedback delay circuit on the part of high output transistors in FIG. 1.

FIG. 2 shows an internal circuit configuration of the feedback delay circuit 11 (12 through 14). The feedback delay circuits 11 through 14 have identical configurations. As shown, inverters I11 and I12 in two stages are connected in series between an input end 31 and an output end 32. The inverter I11 has a CMOS structure that is comprised of a P-channel transistor T11 and an N-channel transistor T12. The P-channel transistor T11 is connected at its gate to the input end 31 and at its source to the power supply. The N-channel transistor T12 is connected at its source to ground and at its gate to the input end 31. Drains of P-channel transistor T11 and the N-channel transistor T12 are connected in common to form an output of the inverter I11.

The inverter I12 has a CMOS structure that is comprised of a P-channel transistor T13 and an N-channel transistor T14 with the addition of another P-channel transistor T15 on the power supply part. The P-channel transistor T13 is connected at its source to the power supply through the P-channel transistor T15 and at its gate to the output of the inverter I11. The N-channel transistor T14 is connected at its source to ground and at its gate to the output of the inverter I11. Drains of the P-channel transistor T13 and the N-channel transistor T14 are connected in common to form an output of the inverter I12, i.e., the output end 32. The gate of the P-channel transistor T15 is connected to a delay control input end 33.

Figure 3:
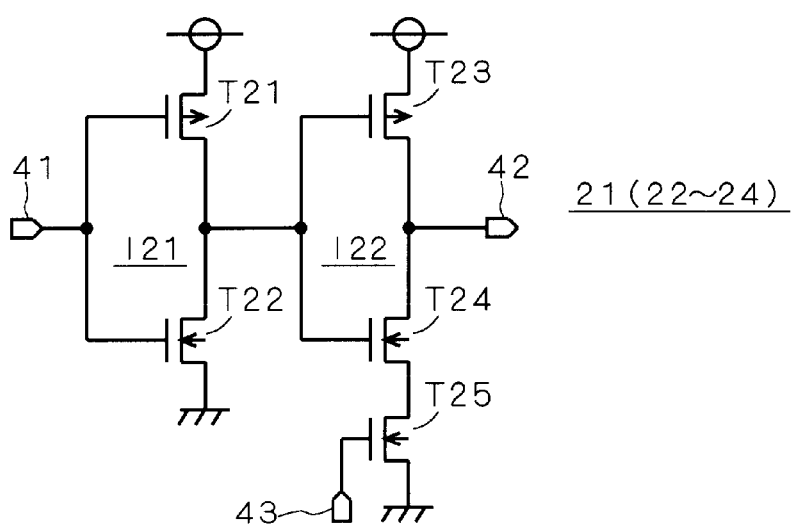
FIG. 3 shows an internal circuit configuration of a feedback delay circuit on the part of low output transistors in FIG. 1.

FIG. 3 shows an internal circuit configuration of the feedback delay circuit 21 (22 through 24). The feedback delay circuits 21 through 24 have identical configurations. As shown, inverters I21 and I22 in two stages are connected in series between an input end 41 and an output end 42. The inverter I21 has a CMOS structure that is comprised of a P-channel transistor T21 and an N-channel transistor T22. The P-channel transistor T21 is connected at its gate to the input end 41 and at its source to the power supply. The N-channel transistor T22 is connected at its source to ground and at its gate to the input end 41. Drains of the P-channel transistor T21 and the N-channel transistor T22 are connected in common to form an output of the inverter 121.

The inverter 122 has a CMOS structure that is comprised of a P-channel transistor T23 and an N-channel transistor T24 with the addition of another N-channel transistor T25 on the ground part. The P-channel transistor T23 is connected at its source to the power supply and at its gate to the output of the inverter 121. The N-channel transistor T24 is connected at its source to ground through the N-channel transistor T25 and at its gate to the output of the inverter 121. Drains of the P-channel transistor T23 and the N-channel transistor T24 are connected in common to form an output of the inverter 122, i.e., the output end 42. The gate of the N-channel transistor T25 is connected to a delay control input end 43.

We will now describe the operation of such an output buffer circuit of the first preferred embodiment when the input signal IN makes a LOW to HIGH transition.

First, a preliminary operation is described. As an initial operation, the feedback initialization N-channel transistor 15 is turned on for example by applying a high input signal IN from the input terminal 1 through the feedback delay circuits 11 through 14 to the gate of the transistor 15, to thereby set the feedback path L1 to its low state.

Then, the feedback switch N-channel transistor 16 is turned on by applying a low input signal IN from the input terminal 1 through the feedback delay circuits 11 through 14 to the inverter 17. This provides electrical connection between the output terminal 2 and the feedback path L1, thereby enabling the feedback capability of the feedback delay circuits 11 through 14. This completes the preliminary operation.

When the input signal IN rises from the low state to the high state, the high-output selecting NAND gates G11 through G14 instantaneously enter their standby state to wait for the delay signals from the feedback delay circuits 11 through 14, respectively.

The outputs of the low-output selecting NOR gates G21 through G24, on the other hand, are all set to their low state, so that the low output transistors QN1 through QN4 are all in their off state. This cuts down on excess current consumption and allows efficient utilization of only the high output transistors QP1 through QP4.

When a HIGH on the input signal IN appears on the delay signal from the feedback delay circuit 11, the high-output selecting NAND gate G11 changes from the high state to the low state and the high output transistor QP1 is turned on.

Similarly, when a HIGH on the input signal IN appears on the delay signals from the respective feedback delay circuits 12 through 14, the high-output selecting NAND gates G12 through G14 change from the high state to the low state and the high output transistors QP2 through QP4 are turned on.

In the case where the delay signal from the feedback delay circuit 14 goes high, the feedback switch N-channel transistor 16 is turned off. This disables the feedback capability and brings the feedback initialization N-channel transistor 15 to its on state. Accordingly, the feedback path L1 is initialized to its low state.

Figure 4:
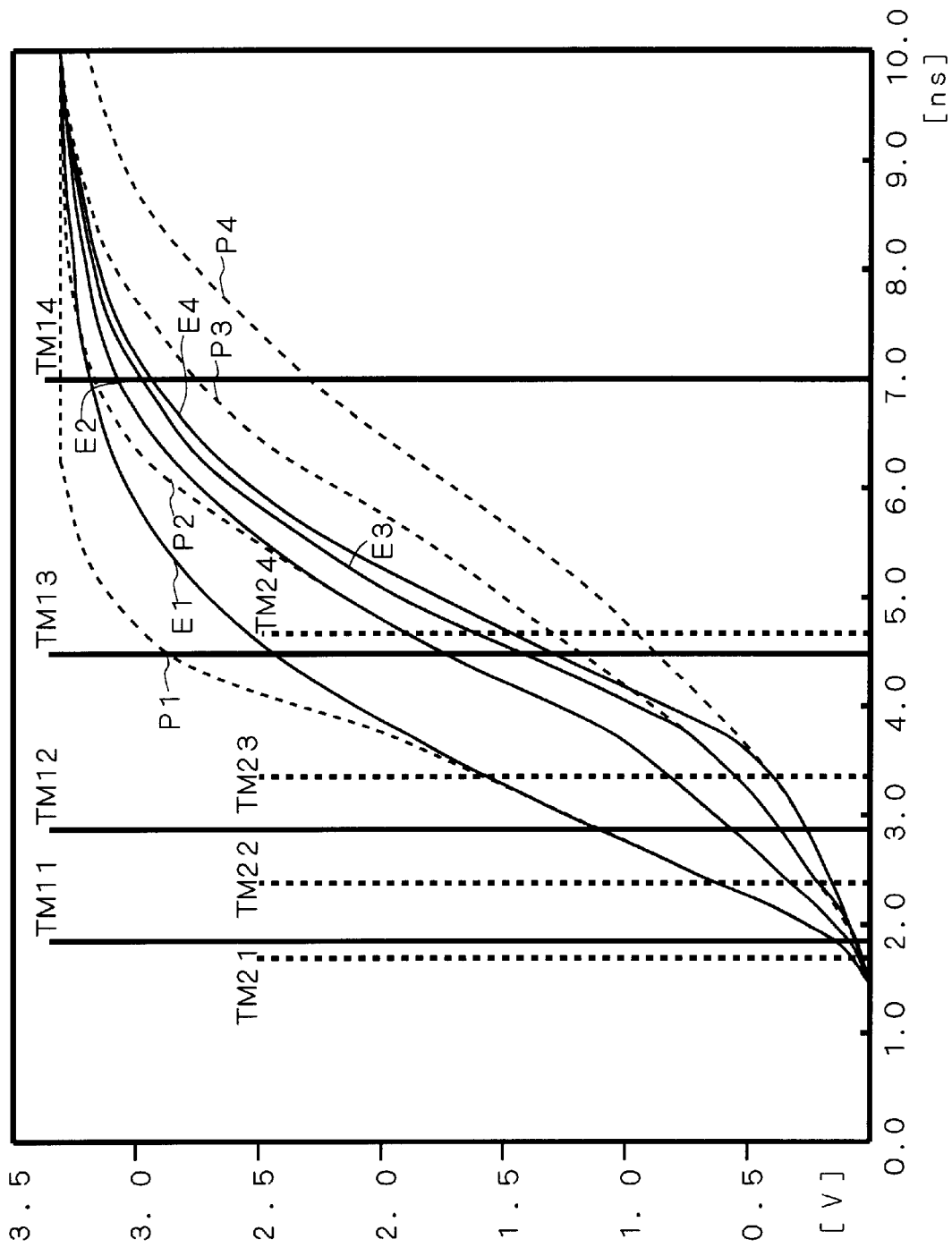
FIG. 4 is a waveform chart showing the operation of the output buffer circuit of the first preferred embodiment.
Figure 14:
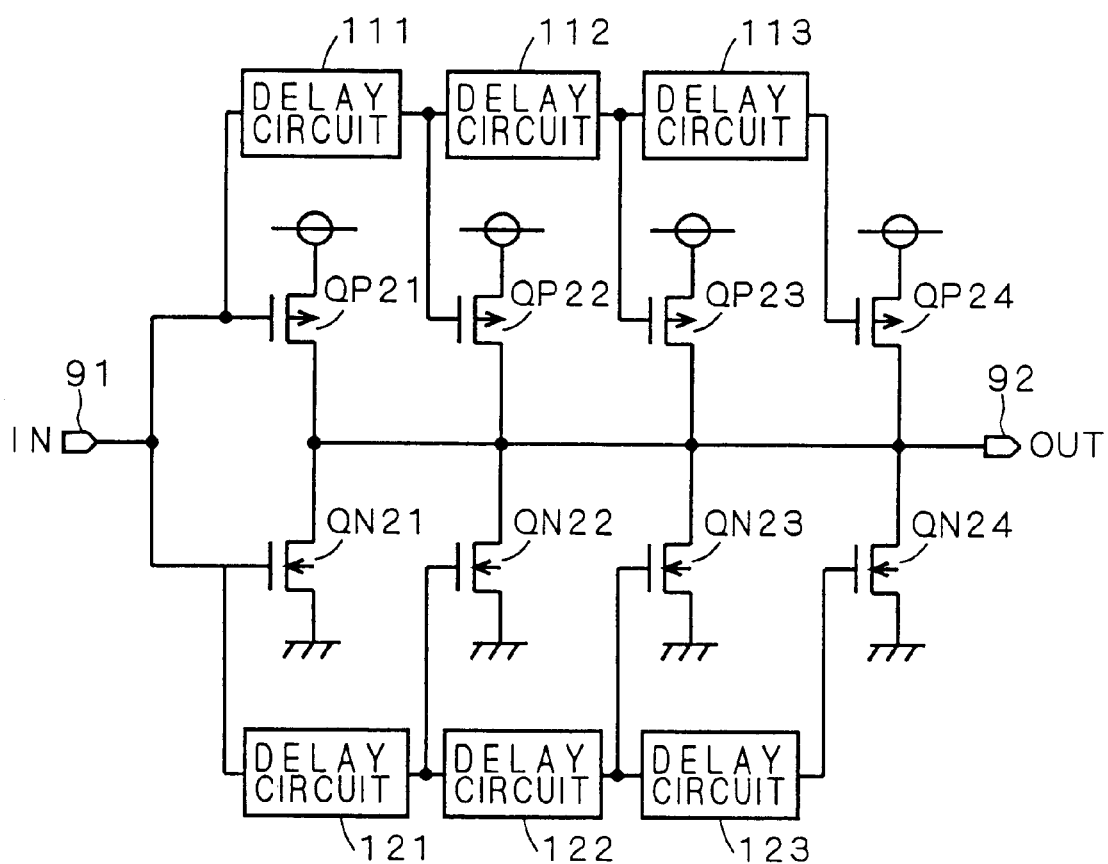
FIG. 14 shows a circuit configuration of a conventional output buffer circuit.

The aforementioned operation is further discussed in detail with reference to FIG. 4. FIG. 4 shows output waveforms of the output signal OUT by way of example. The horizontal axis indicates time (ns) and the vertical axis indicates potential (V). There are shown output waveforms in first to fourth cases where the output terminal 2 is put under four kinds of capacitive loads C1 to C4, respectively. In FIG. 4, P1 through P4 indicate output waveforms of the output signal OUT from the conventional buffer circuit in FIG. 14 in the first to fourth cases, respectively; and E1 through E4 indicate output waveforms of the output signal OUT from the output buffer circuit of the first preferred embodiment in the first to fourth cases, respectively. The relationship among the respective capacitive loads C1 through C4 can be expressed as $C2=2\times C1$, $C3=3\times C1$, $C4=4\times C1$.

The reference characters TM11 through TM14 indicate output times of the feedback delay circuits 11 through 14 in the first case, respectively (i.e., time when the input signal IN appears as the delay signals from the feedback delay circuits 11 through 14); and TM21 through TM24 indicate output times of the feedback delay circuits 11 through 14 in the second case, respectively.

In the first case where the output terminal 2 is put under the load C1 that has the smallest capacitance value among the four loads, the output signal OUT rises rapidly and thus, the P-channel transistors T15 in the respective feedback delay circuits 11 through 14 are weakly turned on. This lengthens signal propagation delay times of the respective feedback delay circuits 11 through 14, thereby delaying the output times TM11 through TM14 and lengthening time intervals therebetween. At these output times TM11 through TM14, the high output transistors QP1 through QP4 are sequentially turned on, respectively.

As indicated by the waveform E1 in FIG. 4, the potential of the output signal OUT is already high enough, i.e., close to its high state, at the times TM13 and TM14. Thus, even if the high output transistors QP3 and QP4 are turned on, they can hardly contribute to drive of the output signal OUT. That is, in the first case, substantially the two high output transistors QP1 and QP2 drive the output signal OUT.

In the second case where the output terminal 2 is put under the load C2 that has a capacitance value two times that in the first case, the rise of the output signal OUT is slower than in the first case and thus, the P-channel transistors 15 in the respective feedback delay circuits 11 through 14 are turned on more strongly than in the first case. This speeds up the output times TM21 through TM24 of the feedback delay circuits 11 through 14 as compared to the output times TM11 through TM14 in the first case and shortens time intervals therebetween. At these output times TM21 through TM24, the high output transistors QP1 through QP4 are sequentially turned on, respectively.

In the second case, as indicated by the waveform E2 in FIG. 4, the potential of the output signal OUT is relatively low even at the time TM24 when the high output transistor QP4 is turned on, so that all the high output transistors QP1 through QP4 contribute to drive of the output signal OUT. That is, substantially all the four high output transistors QP1 through QP4 drive the output signal OUT.

Similarly in the third and fourth cases, the output times of the respective feedback delay circuits 11 through 14 are speeded up more than in the second case to thereby speed up the times at which the respective high output transistors contribute to drive of the output signal OUT.

In this fashion, by changing the delay times of the respective feedback delay circuits 11 through 14 at the rise of the input signal IN according to the potential of the output signal OUT, when load capacity is high, the output buffer circuit of the first preferred embodiment can speed up the times to turn on the high output transistors and if necessary, increase the number of high output transistors that contribute to drive of the output signal OUT.

Consequently, the slew rate of the output waveforms of the output signal OUT can be maintained within a predetermined range, as indicated by the waveforms E1 through E4, regardless of changes of the load on the output terminal 2.

In the case where the input signal IN falls from the high state to the low state, as in the case where the input signal IN rises, the output signal OUT is fed back to the delay control input ends of the respective feedback delay circuits 21 through 24 to change times to turn on the low output transistors QN1 through QN4 and, if necessary, the number of low output transistors (QN1 to QN4) that contribute to drive of the output signal OUT according to the load on the output terminal 2. Consequently, the slew rate of the output waveforms of the output signal OUT can be maintained within a predetermined range regardless of changes of the load on the output terminal 2.

2. Second Preferred Embodiment

Figure 5:
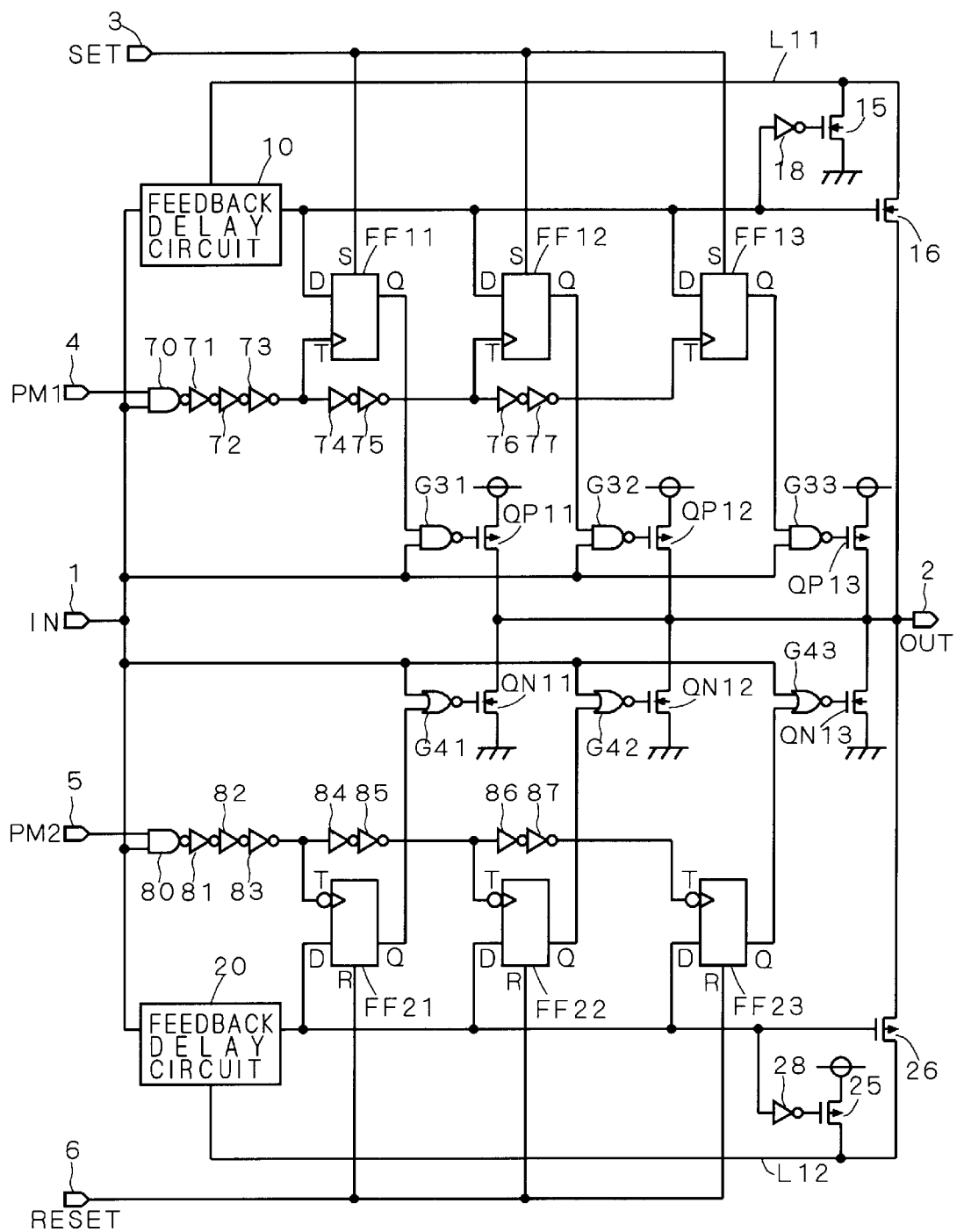
FIG. 5 shows a circuit configuration of an output buffer circuit according to a second preferred embodiment of the present invention.

FIG. 5 shows a circuit configuration of an output buffer circuit according to a second preferred embodiment of the present invention.

As shown, high output transistors QP11 through QP13 and low output transistors QN11 through QN13 are provided in three stages between an input terminal 1 and an output terminal 2.

The high output transistors QP11 through QP13 are connected at their sources to the power supply, at their gates to outputs of high-output selecting NAND gates G31 through G33, respectively, and at their drains in common to the output terminal 2. The low output transistors QN11 through QN13 are connected at their sources to ground, at their gates to outputs of low-output selecting NOR gates G41 through G43, respectively, and at their drains in common to the output terminal 2.

A feedback delay circuit 10 delays the input signal IN received from the input terminal 1 and outputs a delay signal (i.e. relative delay signal) in common to inputs D of respective flip flops FF11 through FF13 each having an asynchronous set input S.

The flip flops FF11 through FF13 also receive a set signal SET from a set terminal 3 at their set inputs S. Outputs Q of the flip flops FF11 through FF13 (i.e. signals relative to the delay signal) are connected to one input of the high-output selecting NAND gates G31 through G33, respectively. The high-output selecting NAND gates G31 through G33 also receive the input signal IN at their other input.

Further, an enabling signal PM1 is applied from an enabling-signal input terminal 4 to one input of a NAND gate 70, and an output of the NAND gate 70 is connected to an input of a first inverter 71 among seven series-connected inverters 71 through 77. The other input of the NAND gate 70 is connected to the input terminal 1. Outputs from the inverters 73, 75, and 77 are applied to toggle inputs T of the flip flops FF11, F12, and FF13, respectively.

A feedback delay circuit 20 delays the input signal IN received from the input terminal 1 and outputs a delay signal (i.e. relative delay signal) in common to inputs D of respective flip flops FF21 through FF23 each having an asynchronous reset input R.

The flip flops FF21 through FF23 also receive a reset signal RESET from a reset terminal 6 at their reset inputs R. Outputs Q of the flip flops FF21 through FF23 (i.e. signals relative to the delay signal) are connected to one input of the low-output selecting NOR gates G41 through G43, respectively. The low-output selecting NOR gates G41 through G43 also receive the input signal IN at their other input.

Further, an enabling signal PM2 is applied from an enabling-signal input terminal 5 to one input of a NAND gate 80, and an output of the NAND gate 80 is connected to an input of a first inverter 81 among seven series-connected inverters 81 through 87. Outputs from the inverters 83, 85 and 87 are inverted and applied to toggle inputs T of the flip flops FF21, FF22, and FF23, respectively.

The delay signal from the feedback delay circuit 10 is applied to a gate of a feedback initialization N-channel transistor 15 through an inverter 18 and to a gate of a feedback switch N-channel transistor 16. The feedback initialization N-channel transistor 15 is connected at its source to ground and at its drain to a feedback path L11. The feedback path L11 is connected to a delay control input end of the feedback delay circuit 10. The feedback switch N-channel transistor 16 is connected at its drain to the feedback path L11 and at its source to the output terminal 2.

The delay signal from the feedback delay circuit 20 is applied to a gate of a feedback initialization P-channel transistor 25 through an inverter 28 and to a gate of a feedback switch transistor 26. The feedback initialization P-channel transistor 25 is connected at its source to the power supply and at its drain to a feedback path L12. The feedback path L12 is connected to a delay control input end of the feedback delay circuit 20. The feedback switch P-channel transistor 26 is connected at its drain to the feedback path L12 and at its source to the output terminal 2.

Figure 6:
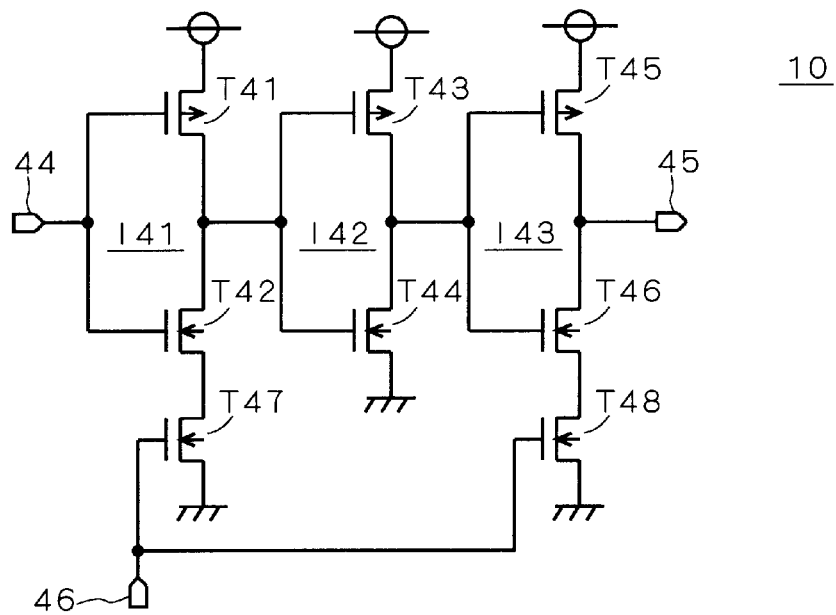
FIG. 6 shows an internal circuit configuration of a feedback delay circuit on the part of high output transistors in FIG. 5.

FIG. 6 shows an internal circuit configuration of the feedback delay circuit 10. As shown, inverters 141 through 143 in three stages are connected in series between an input end 44 and an output end 45. The inverter 141 has a CMOS structure that is comprised of a P-channel transistor T41 and an N-channel transistor T42 with the addition of another N-channel transistor T47 on the ground part. The P-channel transistor T41 is connected at its gate to the input end 44 and at its source to the power supply. The N-channel transistor T42 is connected at its source to ground through the N-channel transistor T47 and at its gate to the input end 44. Drains of the P-channel transistor T41 and the N-channel transistor T42 are connected in common to form an output of the inverter I41.

The inverter 142 has a CMOS structure that is comprised of a P-channel transistor T43 and an N-channel transistor T44. The P-channel transistor T43 is connected at its source to the power supply and at its gate to the output of the inverter 141. The N-channel transistor T44 is connected at its source to ground and at its gate to the output of the inverter 141. Drains of the P-channel transistor T43 and the N-channel transistor T44 are connected in common to form an output of the inverter 142.

The inverter I43 has a CMOS structure that is comprised of a P-channel transistor T45 and an N-channel transistor T46 with the addition of another N-channel transistor 48 on the ground part. The P-channel transistor T45 is connected at its gate to the output of the inverter 142 and at its source to the power supply. The N-channel transistor T46 is connected at its source to ground through the N-channel transistor T48 and at its gate to the output of the inverter 142. Drains of the P-channel transistor T45 and the N-channel transistor T46 are connected in common to form an output of the inverter 143, i.e., the output end 45.

Gates of the N-channel transistors T47 and T48 are connected in common to a delay control input end 46.

Figure 7:
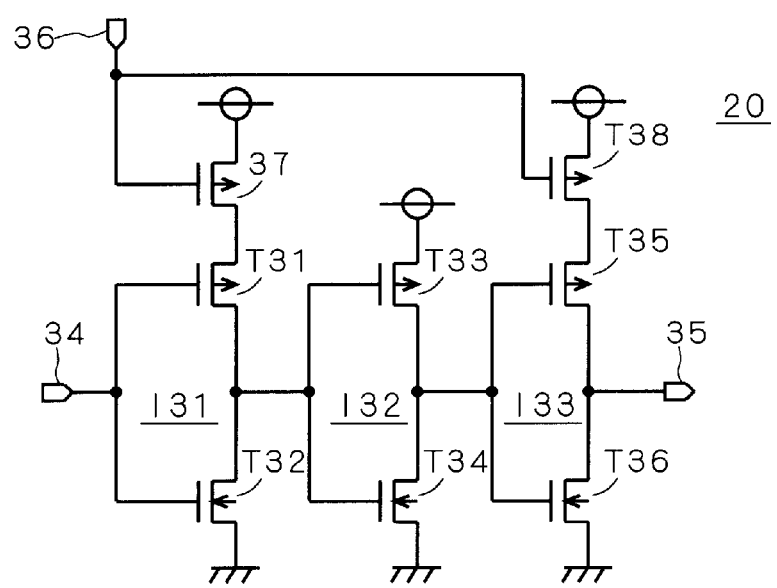
FIG. 7 shows an internal circuit configuration of a feedback delay circuit on the part of low output transistors in FIG. 5.

FIG. 7 shows an internal circuit configuration of the feedback delay circuit 20. As shown, inverters 131 through 133 in three stages are connected in series between an input end 34 and an output end 35. The inverter 131 has a CMOS structure that is comprised of a P-channel transistor T31 and an N-channel transistor T32 with the addition of another P-channel transistor T37 on the power supply part. The P-channel transistor T31 is connected at its gate to the input end 34 and at its source to the power supply through the P-channel transistor T37. The N-channel transistor T32 is connected at its source to ground and at its gate to the input end 34. Drains of the P-channel transistor T31 and the N-channel transistor T32 are connected in common to form an output of the inverter 131.

The inverter 132 has a CMOS structure that is comprised of a P-channel transistor T33 and an N-channel transistor T34. The P-channel transistor T33 is connected at its source to the power supply and at its gate to the output of the inverter 131. The N-channel transistor T34 is connected at its source to ground and at its gate to the output of the inverter 131. Drains of the P-channel transistor T33 and the N-channel transistor T34 are connected in common to form an output of the inverter 132.

The inverter 133 has a CMOS structure that is comprised of a P-channel transistor T35 and an N-channel transistor T36 with the addition of another P-channel transistor T38 on the power supply part. The P-channel transistor T35 is connected at its source to the power supply through the P-channel transistor T38 and at its gate to the output of the inverter 132. The N-channel transistor T36 is connected at its source to ground and at its gate to the output of the inverter 132. Drains of the P-channel transistor T35 and the N-channel transistor T36 are connected in common to form an output of the inverter 133, i.e., the output end 35.

Gates of the P-channel transistors T37 and T38 are connected in common to a delay control input end 36.

We will now describe the operation of such an output buffer circuit when the input signal IN makes a LOW to HIGH transition.

First, a preliminary operation is described. As an initial operation, the feedback initialization N-channel transistor 15 is turned on by applying a high input signal IN from the input terminal 1 through the feedback delay circuit 10 and the inverter 18 to the gate of the transistor N15, to thereby set the feedback path L11 of the feedback delay circuit 10 to its low state. Then, the outputs (control data) Q of the flip flops FF11 through FF13 are initialized to their high state by applying a high set signal SET to the set inputs S of the flip flops FF11 through FF13, and the outputs (control data) Q of the flip flops FF21 through FF23 are initialized to their low state by applying a high reset signal RESET to the reset inputs R of the flip flops FF21 through FF23. Also, the enabling signal PM1 is set to its high state Next, the feedback switch N-channel transistor 16 is turned on by applying a low input signal IN from the input terminal 1 through the feedback delay circuits 10 to the gate of the transistor 16. This provides electrical connection between the output terminal 2 and the feedback path L11, thereby enabling the feedback capability of the feedback delay circuit 10. This completes the preliminary operation.

When the input signal IN rises from the low state to the high state, the high-output selecting NAND gates G31 through G34 instantaneously enter their standby state to wait for output signals from the outputs Q of the flip flops FF11 through FF13, respectively. Here, the initial state of the outputs Q of the flip flops FF11 through FF13 is high, so that all the outputs from the high-output selecting NAND gates G31 through G33 become low. Accordingly, all the high output transistors QP11 through QP13 are turned on.

The outputs of the low-output selecting NOR gates G41 through G43, on the other hand, are all set to their low state, so that all the low output transistors QN1 through QN4 are in their off state. This cuts down on excess current consumption and allows efficient utilization of only the high output transistors QP11 through QP13.

The rise of the input signal IN is applied to the other input of the NAND gate 70 whose another input is in the high state, and transmitted through the inverters 71 through 73 to the toggle input T of the flip flop FF11 after a lapse of a delay time ΔT1, through the inverters 71 through 75 to the toggle input T of the flip flop FF13 after a lapse of a delay time ΔT2, and through the inverters 71 through 77 to the toggle input T of the flip flop FF13 after a lapse of a delay time ΔT3.

The delay signal from the feedback delay circuit 10 is thus applied to the inputs D of the flip flops FF11 through FF13 after the expiration of the delay times ΔT1, through ΔT3, respectively, from the rise of the input signal IN. Consequently, a high output transistor corresponding to a flip flop whose output Q changes from the high state to the low state among the flip flops FF11 through FF13, is turned off, and a high output transistor corresponding to a flip flop whose output Q is held high remains in its on state.

If the delay signal from the feedback delay circuit 10 goes low after a predetermined period of time, the feedback switch N-channel transistor 16 is turned off. This disables the feedback capability of the feedback delay circuit 10 and brings the feedback initialization N-channel transistor 15 into its on state. Accordingly, the feedback path L11 is initialized to its low state.

Figure 8:
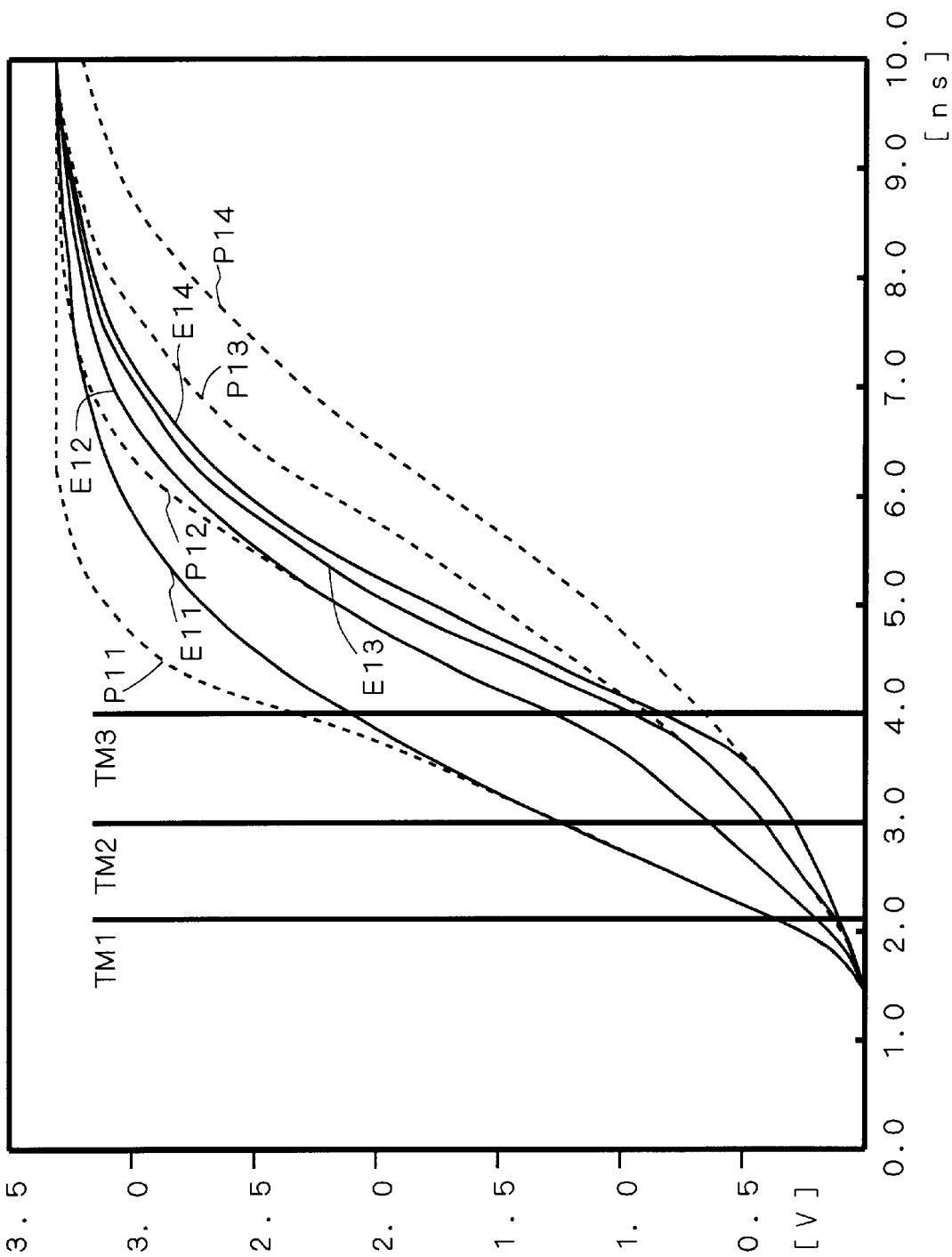
FIG. 8 is a waveform chart showing the operation of the output buffer circuit of the second preferred embodiment.

The aforementioned operation is further discussed in detail with reference to FIG. 8. FIG. 8 shows output waveforms of the output signal OUT by way of example. The horizontal axis indicates time (ns) and the vertical axis indicates potential (V). There are shown output waveforms in first to fourth cases where the output terminal 2 is put under four kinds of capacitive loads C1 to C4, respectively. In FIG. 8, P11 through P14 indicate output waveforms of the output signal OUT from the conventional buffer circuit in FIG. 14 in the first to fourth cases, respectively; and E11 through E14 indicate output waveforms of the output signal OUT from the output buffer circuit of the first preferred embodiment in first to fourth cases, respectively. The relationship among the respective capacitive loads C1 through C4 can be expressed as C2=2×C1, C3=3×C1, C4=4×C1.

The reference characters TM1 through TM3 indicate input times at the inputs D of the flip flops FF11 through FF13, respectively. The times TM1 through TM3 are determined by the delay times ΔT1 through ΔT3 caused by the NAND gate 70 and the inverters 71 through 77.

In the first case where the output terminal 2 is put under the load C1 that has the smallest capacitance value among the four loads, the output signal OUT rises rapidly as indicated by the waveform E11 in FIG. 8 and thus, the N-channel transistors T47 and T48 in the feedback delay circuit 10 are strongly turned on. This shortens a signal propagation delay time of the feedback delay circuit 10 and ensures that the delay signal from the feedback delay circuit 10 becomes low before the time T2. That is, the delay signal from the feedback delay circuit 10 are high at the time TM1 but low at the times TM2 and TM3. Accordingly, the flip flops FF11, FF12, and FF13 receive "high", "low", and "low" control data, respectively.

In the first case, therefore, only the high output transistor QP11 remains in its on state after the time TM3 and the other high output transistors QP12 and QP13 are turned off.

In the fourth case where the output terminal 2 is put under the load C4 (4×C1) that has a capacitance value four times that in the first case, the rise of the output signal OUT is much slower than in the first case as indicated by the waveform E14 in FIG. 8 and thus, the N-channel transistors T47 and T48 in the feedback delay circuit 10 are fairly weakly turned on as compared to those in the first case. Thus, the signal propagation delay time of the feedback delay circuit 10 becomes longer than that in the first case, and the delay signal from the feedback delay circuit 10 remains in its high state even after the time TM3. Accordingly, the delay signal from the feedback delay circuit signal is high through the times TM1 through TM3 and all the flip flops FF11, FF12, and FF13 receive "high" control data.

In the fourth case, therefore, all the three high output transistors QP11 through QP13 are in their on state after the time TM3.

Similarly, in the second and third cases, the number of high output transistors (two or three) that are on after the time TM3 is controlled by speeding up the time when the delay signal from the feedback delay circuit 10 becomes low than in the first case.

In this fashion, by changing the delay time of the feedback delay circuit 10 at the rise of the input signal IN according to the potential of the output signal OUT, when load capacity is large, the output buffer circuit of the second preferred embodiment can increase the number of high output transistors to be turned on.

Consequently, as indicated by the waveforms E11 through E14, the slew rate of the output waveforms of the output signal OUT can be maintained within a predetermined range regardless of changes of the load on the output terminal 2.

In addition, since unnecessary high output transistors are turned off after the time TM3, the output buffer circuit of the second preferred embodiment can minimize current consumption compared to the conventional output buffer circuit where all output transistors are always in their on state.

In the case where the input signal IN falls from the high state to the low state (i.e., the enabling signal PM2 is high in the preliminary operation), as in the case where the input signal IN rises, the output signal OUT is fed back through the feedback path L12 to the delay control input end of the feedback delay circuit 20 to change the number of low output transistors QNl1 through QN13 that are on after the time TM3, according to the load on the output terminal 2. Consequently, the slew rate of the output waveforms of the output signal OUT can be maintained within a predetermined range regardless of changes of the load on the output terminal 2.

3. Third Preferred Embodiment

Figure 9:
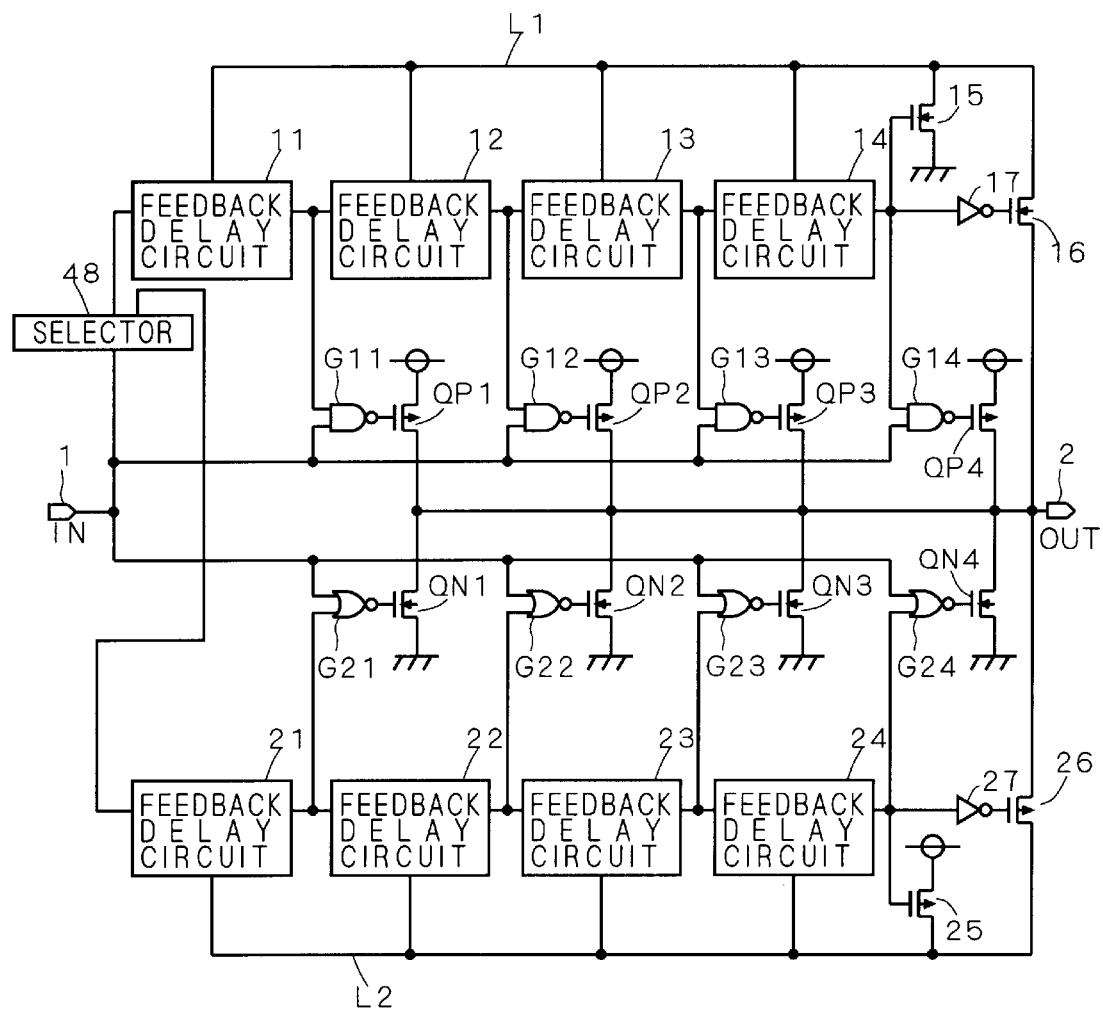
FIG. 9 shows a circuit configuration of an output buffer circuit according to a third preferred embodiment of the present invention.

FIG. 9 shows a circuit configuration of an output buffer circuit according to a third preferred embodiment of the present invention. As shown, a switching selector 48 is added to the configuration of the first preferred embodiment in FIG. 1. The switching selector 48 receives the input signal IN and performs signal switching by transmitting the input signal IN to the feedback delay circuit 11 when the input signal IN makes a rising transition (first transition) from the low state to the high state and transmitting the input signal IN to the feedback delay circuit 21 when the input signal IN makes a falling transition (second transition) from the high state to the low state. The other components are identical to those in the output buffer circuit of the first preferred embodiment and thus not described in this preferred embodiment.

With such a configuration, the output buffer circuit of the first preferred embodiment can apply the input signal IN to only either of the feedback delay circuits 11 and 21 which is on the part of an output transistor necessary to be activated. This prevents unnecessary application of the input signal IN to the feedback delay circuits, thereby cutting down on current consumption.

Alternatively, current consumption can also be reduced by providing a selector, which is equivalent to the switching selector 48, between the feedback delay circuits 10, and the input terminal 1 in the output buffer circuit of the second preferred embodiment in FIG. 5.

4. Fourth Preferred Embodiment

Figure 10:
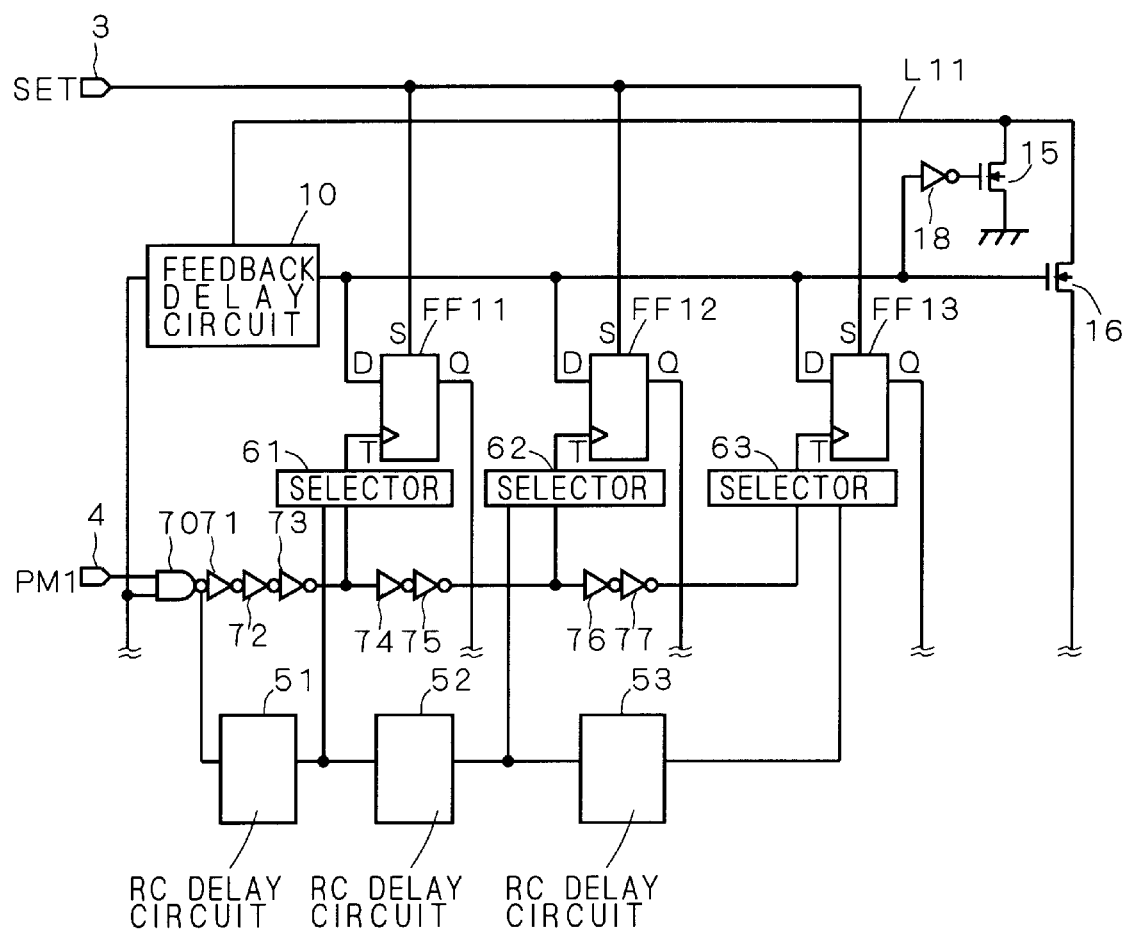
FIG. 10 shows a circuit configuration of an output buffer circuit according to a fourth preferred embodiment of the present invention.

FIG. 10 shows a circuit configuration of an output buffer circuit according to a fourth preferred embodiment of the present invention. As shown, RC delay circuits 51 through 53 and selectors 61 through 63 are added on the part of the high output transistors QP11 through QP13 (not shown in FIG. 10) in the output buffer circuit of the second preferred embodiment in FIG. 5. Although not shown in FIG. 10, another RC delay circuits and selectors, which are equivalent to the RC delay circuits 51 through 53 and the selectors 61 through 63, are also provided on the part of the low output transistors QN11 through QN13. The other components are identical to those in the output buffer circuit of the second preferred embodiment and thus not described in this preferred embodiment.

With such a configuration, the output buffer circuit of the third preferred embodiment applies a control signal that indicates a selection by an external device (not shown) to the selectors 61 through 63 so that the selectors 61 through 63 can select delay signals from the RC delay circuits 51 through 53 which are to be given to the toggle inputs T of the respective flip flops FF11 through FF13.

The RC delay circuits 51 through 53 have the property of being independent of temperature and variations in manufacturing process. Thus, if accuracy in input times at which the flip flops FF11 through FF13 receive the delay signal from the feedback delay circuit 10 is improved by using delay signals from the RC delay circuits 51 through 53, the slew rate of the output waveforms of the output signal OUT from the output buffer circuit can be maintained within a predetermined range with higher accuracy.

Further, it is possible to verify whether a difference between the delay time by the NAND gate 70 and the inverters 71 through 77 and the delay time by the RC delay circuits 51 through 53 is within a predetermined range, by means of comparison.

Alternatively, the RC delay circuits on the part of the high output transistors QP11 through QP13 and the RC delay circuits on the part of the low output transistors QN11 through QN13 may have different delay capability.

5. Fifth Preferred Embodiment

Figure 11:
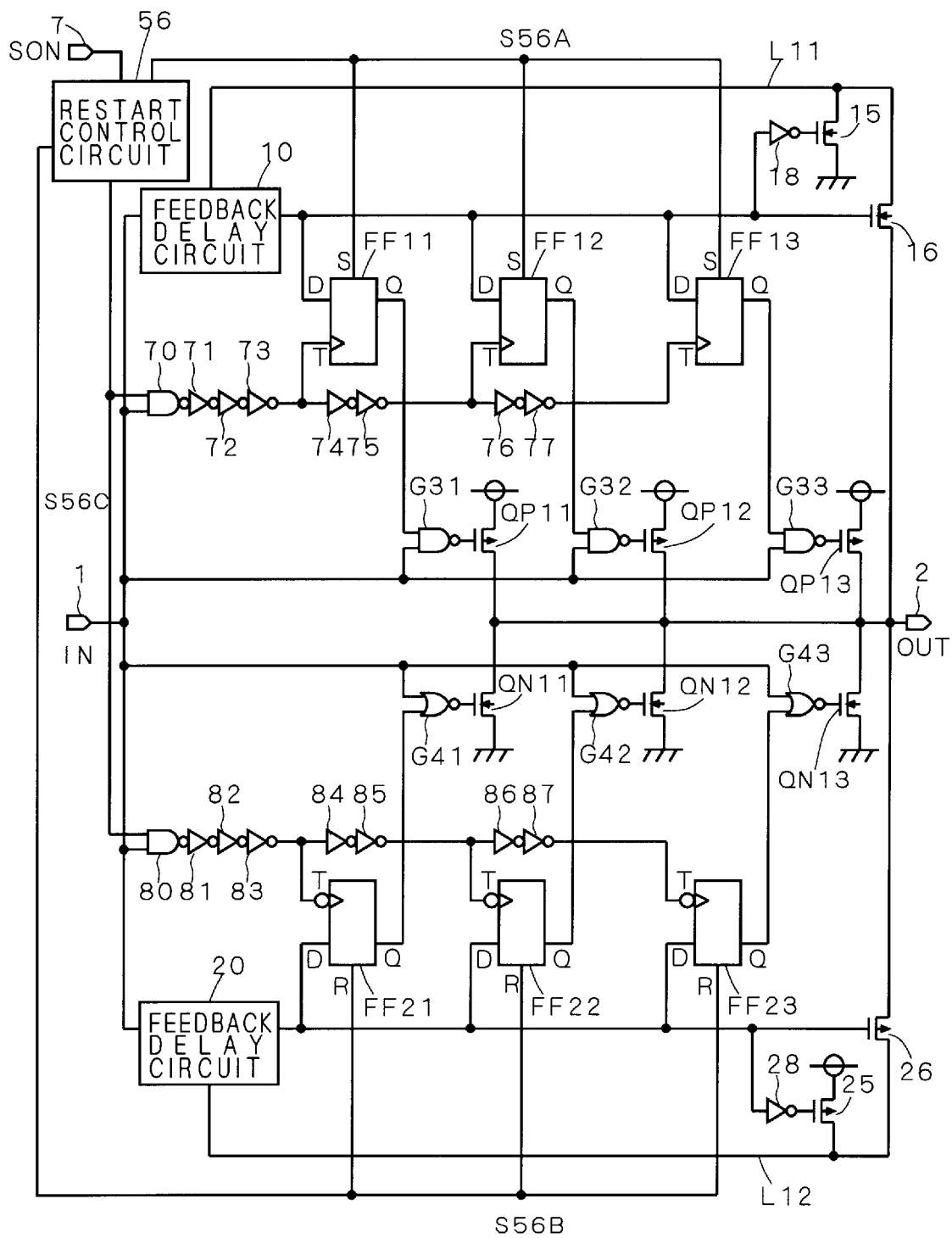
FIG. 11 shows a circuit configuration of an output buffer circuit according to a fifth preferred embodiment of the present invention.

FIG. 11 shows a circuit configuration of an output buffer circuit according to a fifth preferred embodiment of the present invention. As shown, a power turn-on terminal 7 and a restart control circuit 56 are substituted for the set terminal 3 and the enabling-signal input terminals 4 and 5 in the output buffer circuit of the second preferred embodiment in FIG. 5.

The restart control circuit 56 receives a power supply signal SON from the power turn-on terminal 7 and outputs a control signal S56A to the set inputs S of the flip flops FF11 through FF13, a control signal S56B to the reset inputs R of the flip flops FF21 through FF23, and a control signal S56C to one inputs of the NAND gates 70 and 80. The power supply signal SON is a signal to be asserted at power-on or at reset.

During the active state of the power supply signal SON, the restart control circuit 56 places the control signals S56A, S56B, and S56C in their high states and performs setting operation on the flip flops FF11 through FF13, reset operation on the flip flops FF21 through FF23, and the act of enabling delay paths from the input signal IN to the toggle inputs T of the respective flip flops through the NAND gate 70 and the inverters 71 to 77 or through the NAND gate 80 and the inverters 81 to 87. By so doing, buffering operation of the output buffer circuit of the fifth preferred embodiment is restarted (i.e., buffering of the input signal IN in consideration with the load on the output terminal 2 described in the second preferred embodiment). The other components are identical to those in the output buffer circuit of the second preferred embodiment and thus not described in this embodiment.

By restarting the buffering operation at every reset or power-on, the output buffer circuit of the fifth preferred embodiment can stabilize the level of the output signal and thereby regularly avoid the risk of fluctuations in the output signal OUT due to changes of the load on the output terminal 2.

6. Sixth Preferred Embodiment

Figure 12:
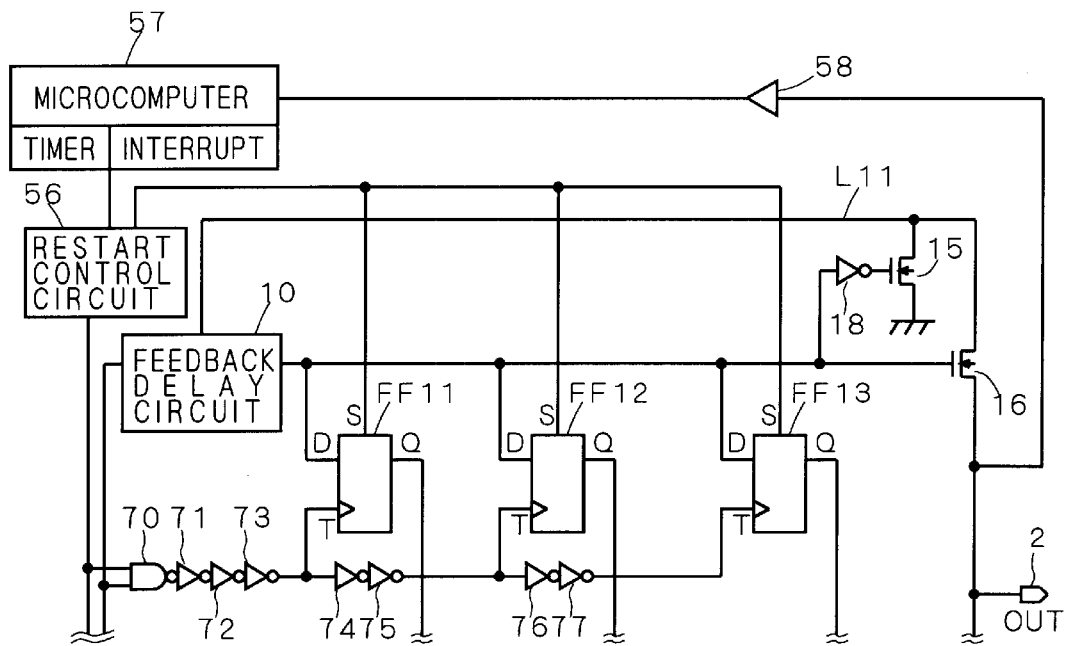
FIG. 12 shows a circuit configuration of an output buffer circuit according to a sixth preferred embodiment of the present invention.

FIG. 12 shows a circuit configuration of an output buffer circuit according to a sixth preferred embodiment of the present invention. As shown, a microcomputer 57 and an input buffer 58 are substituted for the power turn-on terminal 7 in the configuration of the fifth preferred embodiment.

The input buffer 58 receives and buffers the output signal OUT and applies its output signal to the microcomputer 57. On the basis of the output signal from the input buffer 58, the microcomputer 57 detects changes of the load on the output terminal 2, using a previously stored program. The microcomputer 57 further has the timer function, for monitoring the potential of the output signal OUT at predetermined time intervals on the basis of the output signal from the input buffer 58. If fluctuations in the potential of the output signal OUT exceeds a predetermined criterion, the microcomputer 57 serves an interrupt to indicate restart operation to the restart control circuit 56. The other components shown in FIG. 12 and parts not shown are identical to those in the output buffer circuit of the fifth preferred embodiment in FIG. 11.

If the microcomputer 57 indicates restart operation, the restart control circuit 56 places the control signals S56A, S56B, and S56C in their high states and performs setting operation on the flip flops FF11 through FF13 and the act of enabling the delay paths from the input signal IN to the toggle inputs T of the respective flop flops, to thereby restart the buffering operation of the output buffer circuit of the sixth preferred embodiment.

In this fashion, when the microcomputer 57 detects great fluctuations in the potential of the output signal OUT in monitoring, the buffering operation is restarted to stabilize the level of the output signal OUT. This allows the output buffer circuit of the sixth preferred embodiment to certainly suppress fluctuations in the output signal OUT while regularly monitoring the load on the output terminal 2.

Alternatively, the risk of fluctuations in the output signal OUT due to changes of the load on the output terminal 2 can also be avoided by using the timer function of the microcomputer 57 to serve an interrupt to indicate restart operation to the restart control circuit 56. That is, the output buffer circuit of the sixth preferred embodiment can perform both the regular restart operation and the restart operation based on the monitoring of the output signal OUT.

7. Seventh Preferred Embodiment

Figure 13:
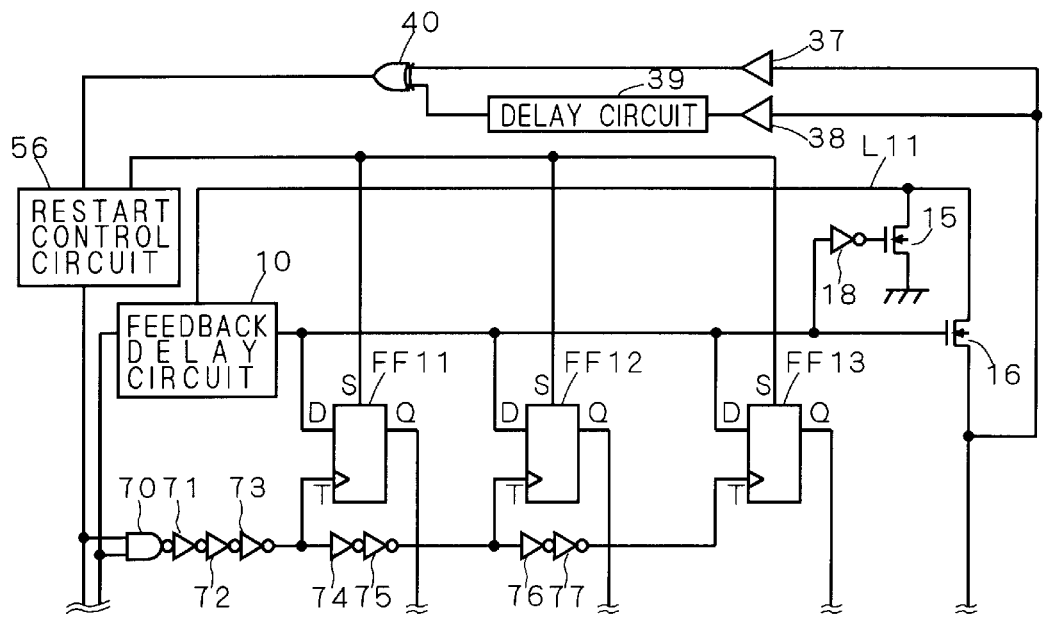
FIG. 13 shows a circuit configuration of an output buffer circuit according to a seventh preferred embodiment of the present invention.

FIG. 13 shows a circuit configuration of an output buffer circuit according to a seventh preferred embodiment of the present invention. As shown, input buffers 37, 38, a delay circuit 39, and an XOR gate 40 are substituted for the power turn-on terminal 7 in the configuration of the fifth preferred embodiment in FIG. 11.

The input buffer 37 receives the output signal OUT and applies its output signal to one input of the XOR gate 40. The input buffer 38 receives the output signal OUT and applies its output signal to the other input of the XOR gate 40 through the delay circuit 39.

The input buffers 37 and 38 have different threshold voltages. For instance, the threshold voltage of the input buffer 37 is set to about 80% of the high level, and the threshold voltage of the input buffer 38 is set to about 70% of the high level. An output signal from the XOR gate 40 is applied to the restart control circuit 56. Although not shown in FIG. 13, circuits which are equivalent to the input buffers 37 and 38, the delay circuit 39, and the XOR gate 40 are also provided on the part of the low output transistors QN11 through QN13 (not shown in FIG. 13). The other components in FIG. 13 and parts not shown are identical to those in the configuration of the fifth preferred embodiment in FIG. 11.

When the XOR gate 40 outputs a high output signal indicating restart operation for the delay time of the delay circuit 39, the restart control circuit 56 places the control signals S56A, S56B, and S56C in their high states and performs setting operation on the flip flops FF11 through FF13 and the act of enabling the delay paths from the input signal IN to the toggle inputs T of the respective flip flops, to thereby restart buffering operation of the output buffer circuit of the seventh preferred embodiment.

In this fashion, whenever anomalies are detected in the output signal OUT, e.g., whenever the level of the output signal OUT changes from under 70% of the high level to over 80% thereof during times exceeding the delay time of the delay circuit 39, the XOR gate 40 outputs a high output signal to restart the buffering operation. This allows the output buffer circuit of the seventh preferred embodiment to certainly suppress fluctuations in the output signal OUT while monitoring the load on the output terminal 2 all the time.

Further, the output buffer circuit of the seventh preferred embodiment that is comprised only of logic circuits without using a microcomputer having a previously stored program simplifies the circuit configuration as compared to that of the sixth preferred embodiment.

While the invention has been shown and described in detail, the foregoing description is in all aspects illustrative and not restrictive. It is therefore understood that numerous modifications and variations can be devised without departing from the scope of the invention.

What is claimed is:

1. An output buffer circuit comprising:
    an input terminal receiving an input signal;
    an output terminal outputting an output signal;
    at least one feedback delay circuit for receiving said input signal and said output signal as a feedback signal and for delaying said input signal by a plurality of delay times to output a plurality of delay signals, said plurality of delay times each varying according to a potential of said output signal; and
    at least one output buffer portion for outputting said output signal in response to said plurality of delay signals, a driving capability of said output buffer portion to said plurality of delay signals varying according to said plurality of delay times, wherein said at least one output buffer portion includes a plurality of output buffer portions which are provided in a one-to-one correspondence with said plurality of delay signals.

2. An output buffer circuit comprising:

an input terminal receiving an input signal;

an output terminal outputting an output signal;

at least ones feedback delay circuit for receiving said input signal and said output signal as a feedback signal and for delaying said input signal by a delay time to output a delay signal, said delay time varying according to a potential of said output signal;

a plurality of data storage portions each for storing control data, receiving said delay signal at a different input time that elapses from a logic level transition on said input signal, and if said delay signal causes said logic level transition, setting said control data to indicate a halt in the operation; and at least one output buffer portion for outputting said output signal in response to said input signal, wherein said at least one output buffer portion includes a plurality of output buffer portions provided in a one-to-one correspondence with said plurality of data storage portions, the operating/halting status of each of said plurality of output buffer portions being determined on the basis of said control data stored in a corresponding data storage portion.

3. The output buffer circuit according to claim 1, wherein said input signal has first and second logic levels; and said at least one output buffer portion includes a first logic output portion for setting said output signal to said first logic level under operating conditions on the basis of said plurality of delay signals, and a second logic output portion for setting said output signal to said second logic level under operating conditions on the basis of said plurality of delay signals, said output buffer circuit further comprising:

a first logic output control portion for bringing said first logic output portion into operation when said input signal makes a first transition from said second logic level to said first logic level; and a second logic output control portion for bringing said second logic output portion into operation when said input signal makes a second transition from said first logic level to said second logic level.

4. The output buffer circuit according to claim 3, wherein each of said plurality of delay signals includes first and second logic delay signals; and said at least one feedback delay circuit includes first and second logic delay circuits for delaying said input signal under operation conditions to output said first and second logic delay signals, respectively, said output buffer circuit further comprising:

a selecting portion for bringing said first logic delay circuit into operation when said input signal makes said first transition and bringing said second logic delay circuit into operation when said input signal makes said second transition.

5. The output buffer circuit according to claim 2, further comprising:

an input time setting portion for setting said input time of each of said plurality of data storage portions on the basis of a plurality of RC delay signals obtained by delaying said input signal with RC time constant.

6. The output buffer circuit according to claim 2, further comprising:

an output buffer starting portion for activating said at least one output buffer portion at a time when a predetermined condition is satisfied, by setting said control data in said plurality of storage portions to indicate the operation of said output buffer.

7. The output buffer circuit according to claim 6, wherein said time when said predetermined condition is satisfied includes a time of power-on and a time of reset.

8. The output buffer circuit according to claim 6, wherein said output buffer starting portion has a timer function, for monitoring a state of said output signal at predetermined time intervals and activating said at least one output buffer portion at a time when the state of said output signal does not satisfy a predetermined criterion, as said time when said predetermined condition is satisfied.

9. The output buffer circuit according to claim 6, wherein said output buffer starting portion includes an output potential monitoring portion for performing logical operation on the basis of the potential of said output signal and monitoring the potential of said output signal all the time on the basis of the result of said logical operation; and said time when said predetermined condition is satisfied includes a time when the potential of said output signal does not satisfy a predetermined criterion according to the result of said logical operation.

10. The output buffer circuit according to claim 2, wherein said input signal has first and second logic levels; and said at least one output buffer portion includes a first logic output portion for setting said output signal to said first logic level under operating conditions on the basis of said control data in said plurality of data storage portions, and a second logic output portion for setting said output signal to said second logic level under operating conditions on the basis of said control data in said plurality of data storage portions, said output buffer circuit further comprising:

a first logic output control portion for bringing said first logic output portion into operation when said input signal makes a first transition from said second logic level to said first logic level; and a second logic output control portion for bringing said second logic output portion into operation when said input signal makes a second transition from said first logic level to said second logic level.

11. The output buffer circuit according to claim 10, wherein said delay signal includes first and second logic delay signals; and said at least one feedback delay circuit includes first and second logic delay circuit for delaying said input signal under operation conditions to output said first and second logic delay signals, respectively, said output buffer circuit further comprising:

a selecting portion for bringing said first logic delay circuit into operation when said input signal makes said first transition and bringing said second logic delay circuit ml operation when said input signal makes said second transition.

* * * * *